United States Patent
Fann et al.

(10) Patent No.: US 8,373,991 B2
(45) Date of Patent: Feb. 12, 2013

(54) METAL THERMAL INTERFACE MATERIAL AND THERMAL MODULE AND PACKAGED MICROELECTRONIC COMPONENT CONTAINING THE MATERIAL

(75) Inventors: Yuan-Chang Fann, Hsinchu County (TW); Chun-Mu Chen, Hsinchu County (TW); Cheng-Chou Wong, Hsinchu County (TW); Chih-Tsung Tu, Hsinchu (TW); Jen-Dong Hwang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 192 days.

(21) Appl. No.: 12/172,171

(22) Filed: Jul. 11, 2008

(65) Prior Publication Data
US 2009/0135567 A1 May 28, 2009

(30) Foreign Application Priority Data
Nov. 23, 2007 (TW) .............................. 96144503 A

(51) Int. Cl.
*H05K 7/20* (2006.01)

(52) U.S. Cl. ........ 361/710; 361/704; 361/709; 361/715; 428/348; 257/712

(58) Field of Classification Search .................. 361/704, 361/709, 710, 715, 719, 722
See application file for complete search history.

(56) References Cited

U.S. PATENT DOCUMENTS

| | | | | |
|---|---|---|---|---|
| 5,168,348 A * | 12/1992 | Chu et al. | ....................... | 257/713 |
| 5,323,294 A * | 6/1994 | Layton et al. | ................. | 361/699 |
| 5,325,265 A | 6/1994 | Turlik et al. | | |
| 6,281,573 B1 | 8/2001 | Atwood et al. | | |
| 6,343,647 B2 | 2/2002 | Kim et al. | | |
| 6,498,355 B1 * | 12/2002 | Harrah et al. | ................... | 257/99 |
| 6,504,096 B2 * | 1/2003 | Okubora | ....................... | 174/521 |
| 6,617,683 B2 * | 9/2003 | Lebonheur et al. | ........... | 257/707 |
| 6,724,078 B1 | 4/2004 | Sur et al. | | |
| 6,761,928 B2 | 7/2004 | Hill et al. | | |
| 7,554,190 B2 * | 6/2009 | Macris et al. | ................. | 257/706 |
| 2006/0138644 A1 * | 6/2006 | Houle et al. | ................... | 257/706 |
| 2006/0192222 A1 * | 8/2006 | Chen et al. | ....................... | 257/99 |
| 2008/0107867 A1 * | 5/2008 | Miekka | ........................ | 428/141 |

FOREIGN PATENT DOCUMENTS

| | | |
|---|---|---|
| TW | 502824 | 9/2002 |
| TW | 1251459 | 3/2006 |
| TW | I251459 | 3/2006 |

OTHER PUBLICATIONS

Taiwan Patent Office, Office Action, Patent Application Serial No. 96144503, Oct. 14, 2010, Taiwan.
Office Action, Taiwanese Patent Application Serial No. 96144503, Taiwan Patent Office, Taiwan, May 13, 2011.

* cited by examiner

*Primary Examiner* — Courtney Smith

(57) ABSTRACT

The invention provides a metal thermal interface material (TIM) with through-holes in its body and/or zigzags or wave shapes on its border, which is suitable for use at thermal interfaces of a thermal conduction path from an integrated circuit die to its associated heat sink in a packaged microelectronic component. The invention also includes a thermal module and a packaged microelectronic component including the metal thermal interface material.

20 Claims, 6 Drawing Sheets

METAL THERMAL INTERFACE MATERIAL AND THERMAL MODULE AND PACKAGED MICROELECTRONIC COMPONENT CONTAINING THE MATERIAL

CROSS REFERENCE TO RELATED APPLICATIONS

This application is based upon and claims the benefit of priority from the prior Taiwan Patent Application No. 96144503, filed on Nov. 23, 2007, the entire contents of which are incorporated herein by reference.

BACKGROUND OF THE INVENTION

1. Field of the Invention

The invention relates to a metal thermal interface material, and more particularly to a hollowed-out metal thermal interface material. The invention also relates to a thermal module or a packaged microelectronic component that comprises the hollowed-out metal thermal interface material.

2. Description of the Related Art

Packaged microelectronic components, such as high-luminance light emitting diodes, high power insulated gate bipolar transistors, or central processing units, have been developed to have high power, high response rate, and small volume, resulting in devices with highly non-uniform and massive heat flux. The non-uniform and massive heat must be removed to reduce the operating temperature to be lower than the maximum junction temperature, otherwise the components may be damaged or their performance may be deteriorated. In order to enhance the heat being delivered to ambient atmosphere, it is necessary to apply thermal interface materials (TIMs) in the microelectronic components through heat dissipation elements to achieve low and stable interface thermal resistance.

Among various thermal interface materials (TIMs), thermal greases made of macromolecular compound and phase change materials made of low melting-point alloys (LMAs) are the two kinds of TIMs that are highly desirable in use. However, thermal greases are unsatisfactory for high heat-flux-generating microelectronic components. The main reason is that they are quickly degraded or dried out after being used. They also can be pumped out under cyclic thermal stressing when microelectronic components are cyclically powered on and off. On the other hand, LMAs are usually several times of the thermal conductivity of thermal greases. Therefore, the TIMs made of LMAs perform much better in reducing interface thermal resistance than thermal greases do.

Metal TIMs made of LMAs have a phase change property from a solid state to a cream-like state. And, this phase change is activated at the temperature around the operation temperature of microelectronic component. Thus, when the microelectronic component operates, the applied metal TIMs partially or fully melt to fill out the microscopic irregular cavities between the mutual contact surfaces, which facilitates heat transfers across the interface. In general, Metal TIMs operate by absorbing or releasing heat to melt or solidify according to the temperature fluctuation at contact interface. However, when metal TIMs melt, they may overflow out of the mutual contact surfaces that can lead to many undesired effects, especially such as short circuit of microelectronic components.

To prevent the overflowing of metal TIM's melt, many prior arts have been developed. One is to design metal TIMs with a specific structure. For example, a multi-layer metal TIM has a specific structure with at least one phase-change LMA layer bonded to a based metal foil. However, the multi-layer metal TIMs usually perform worse than conventional single-layer metal TIMs. This is because that the multi-layer metal TIMs have additional heat-conducting interfaces, and their thickness is difficult to be reduced. Another prior art to prevent the melt overflowing is to use a gasket to confine the melt in a specific interface area. However, success to avoid the overflowing by this method is not guaranteed due to possible insufficient enclosing space or uneven clamping pressure or crack of the gasket.

When a metal TIM foil is heated to melt, the melt will flow due to applied clamping pressure to fill the interstices between mutual contact surfaces. The redundant melt may move out of the mutual contact surfaces and accumulate to form many beads surround the contact surfaces. The beads accumulated from redundant melt are apt to escape and cause damage of microelectronic components. As the thickness of metal TIMs increases so does the amount of the redundant melt increase. Therefore, reducing thickness of metal TIMs, for example to smaller than 30 µm, is helpful to reduce the redundant melt and thus avoiding overflowing of the TIM melt. However, the optimum thickness of metal TIMs may depend on what the situations and the conditions in where they are applied, such as surface roughness, flatness and operation temperature, etc. For example, a thin metal TIM may be adequate for the interface between IC heat spreader lid and heat sink due to its low contact thermal resistance, only if the surface flatness of the thermal contact surfaces is not very poor. Another example, a thick metal TIM may be good for the interface between the IC die and its heat spreader lid. Because this is not only can reduce the interface thermal resistance, but also can accommodate the thermal stress between the IC die and its heat spreader lid.

Thus, it is necessary to develop a thermal interface material with a novel structure and an appropriate thickness to avoid overflowing of the melt of the thermal interface material. Besides, by introducing such novel interface materials into packaged microelectronic components, not only the performance of the components can be improved, but also the damage issues associating with overflowing of melt can be avoided.

BRIEF SUMMARY OF THE INVENTION

An exemplary embodiment of a metal thermal interface material, suitable for use at thermal interfaces of a thermal conduction path from an integrated circuit die to its associated heat sink in a packaged microelectronic component, has through-holes in its body and/or zigzags or wave shapes on its border.

Another exemplary embodiment a thermal module, suitable for heat dissipation of a packaged microelectronic component, comprises a heat sink and the said thermal interface material located at thermal interfaces of a thermal conduction path from an integrated circuit die to the heat sink.

Yet another exemplary embodiment of the invention provides a packaged microelectronic component, comprising a substrate having a surface with circuits formed thereon; an integrated circuit die disposed on the said surface and electronically connected to said circuits; a heat dissipation element disposed on the back surface of said integrated circuit die; and a heat sink disposed on the heat dissipation element. A first thermal interface material is disposed between the integrated circuit die and the heat dissipation element and a second thermal interface material is disposed between the heat dissipation element and the heat sink, wherein at least one of the first and second thermal interface materials comprises the aforementioned thermal interface material.

The packaged microelectronic component of some embodiments of the invention comprises a multi-layer substrate having a thermal conductive material, a dielectric layer formed on the thermal conductive material, and circuits formed on the dielectric layer; an integrated circuit die electrically connected to the said circuits of the substrate; a heat sink disposed on the surface of the thermal conductive material; and the aforementioned thermal interface materials disposed at thermal interfaces of a thermal conduction path from the integrated circuit die to the heat sink.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The invention provides a hollowed-out metal thermal interface material to avoid overflowing of the melt of the metal thermal interface material to the outside of the thermal contact interface. The hollowed-out metal thermal interface material has a plurality of through-holes reducing the amount of the melt of the metal thermal interface material, dispersing the melt of the metal thermal interface material, and preventing the melt from accumulating to be running beads at the border of the interface.

Figure 1:
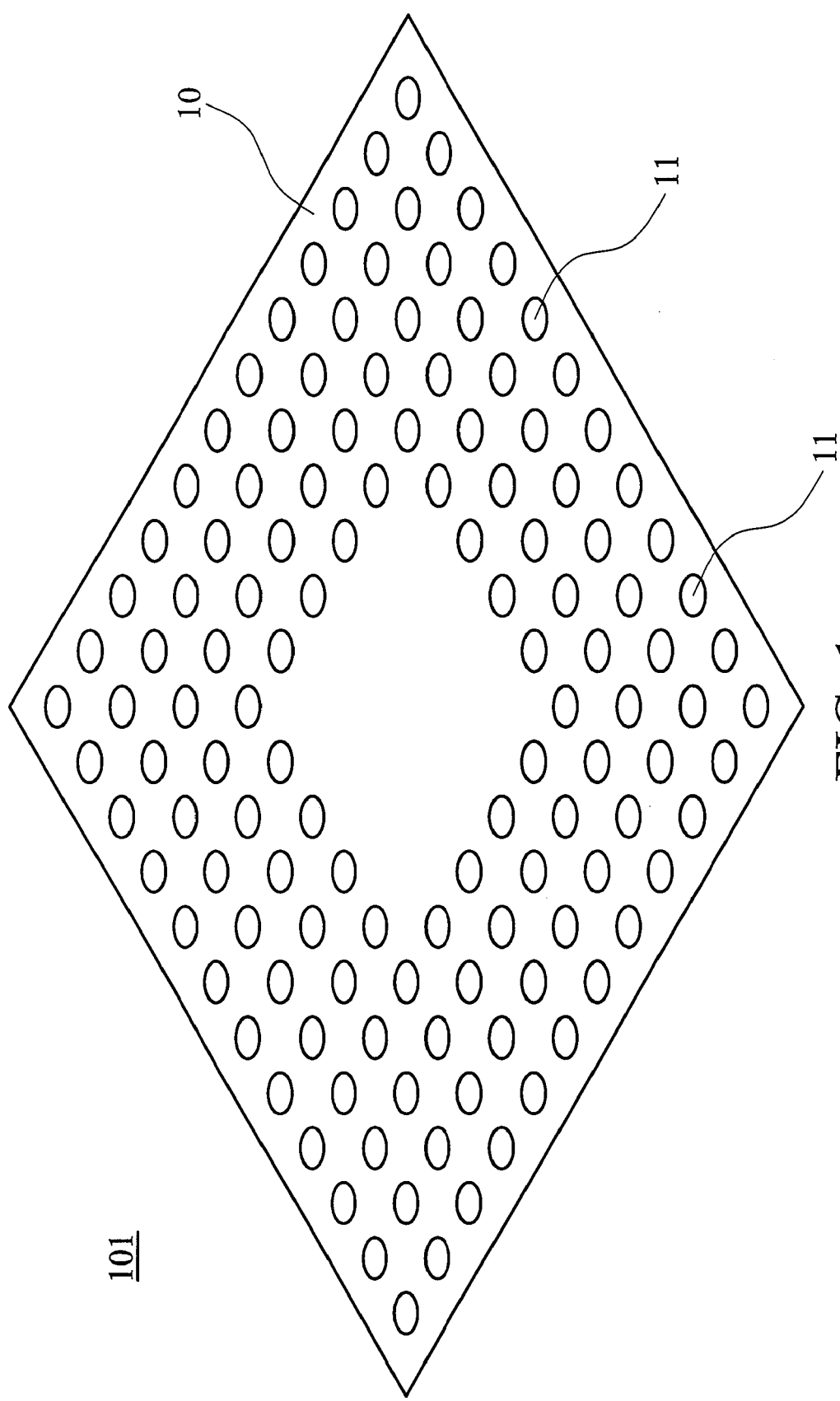
FIGS. 1-3 are diagrams showing the hollowed-out metal thermal interface material of the embodiments of the invention.
Figure 2:
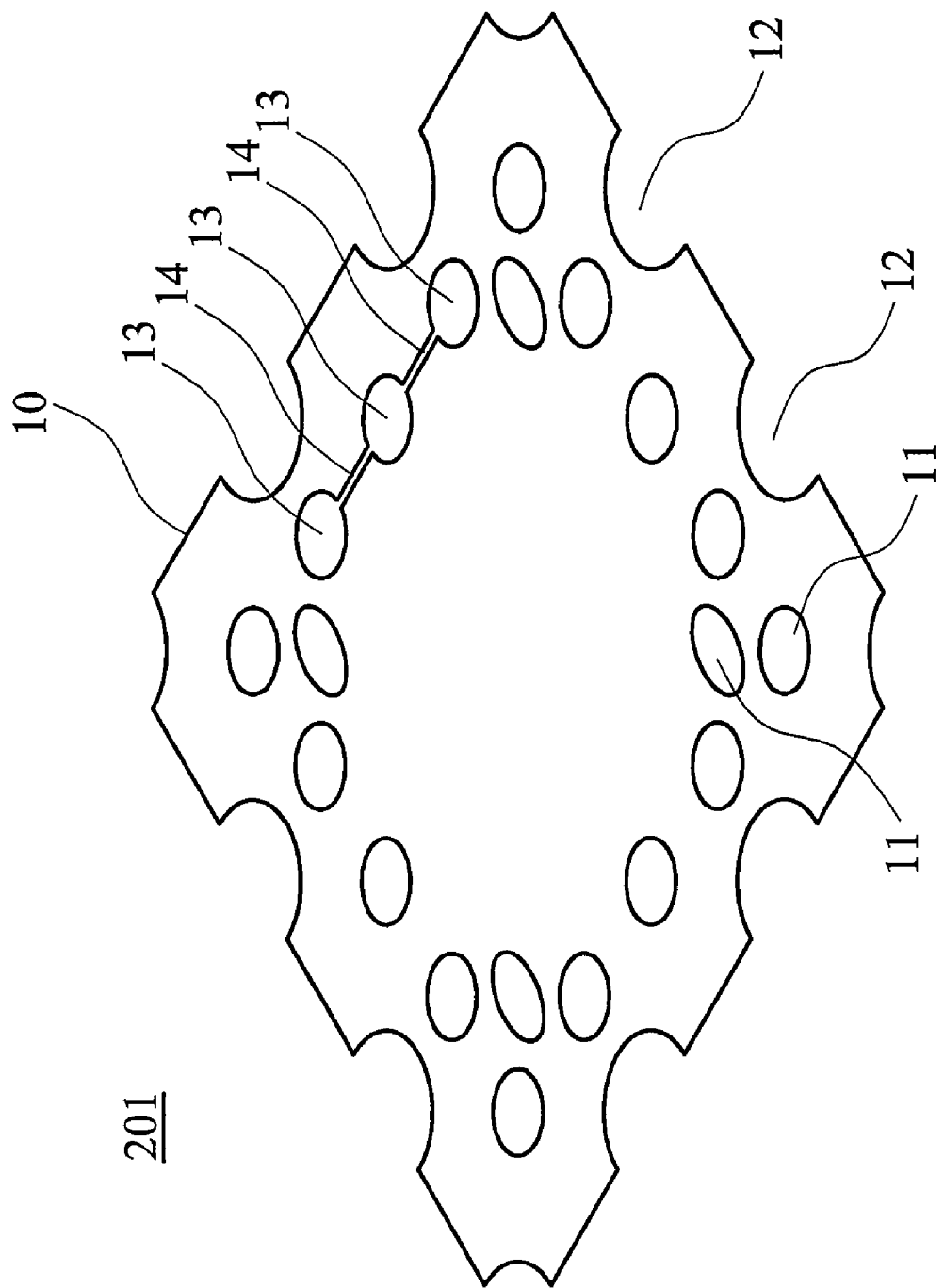
Figure 3:
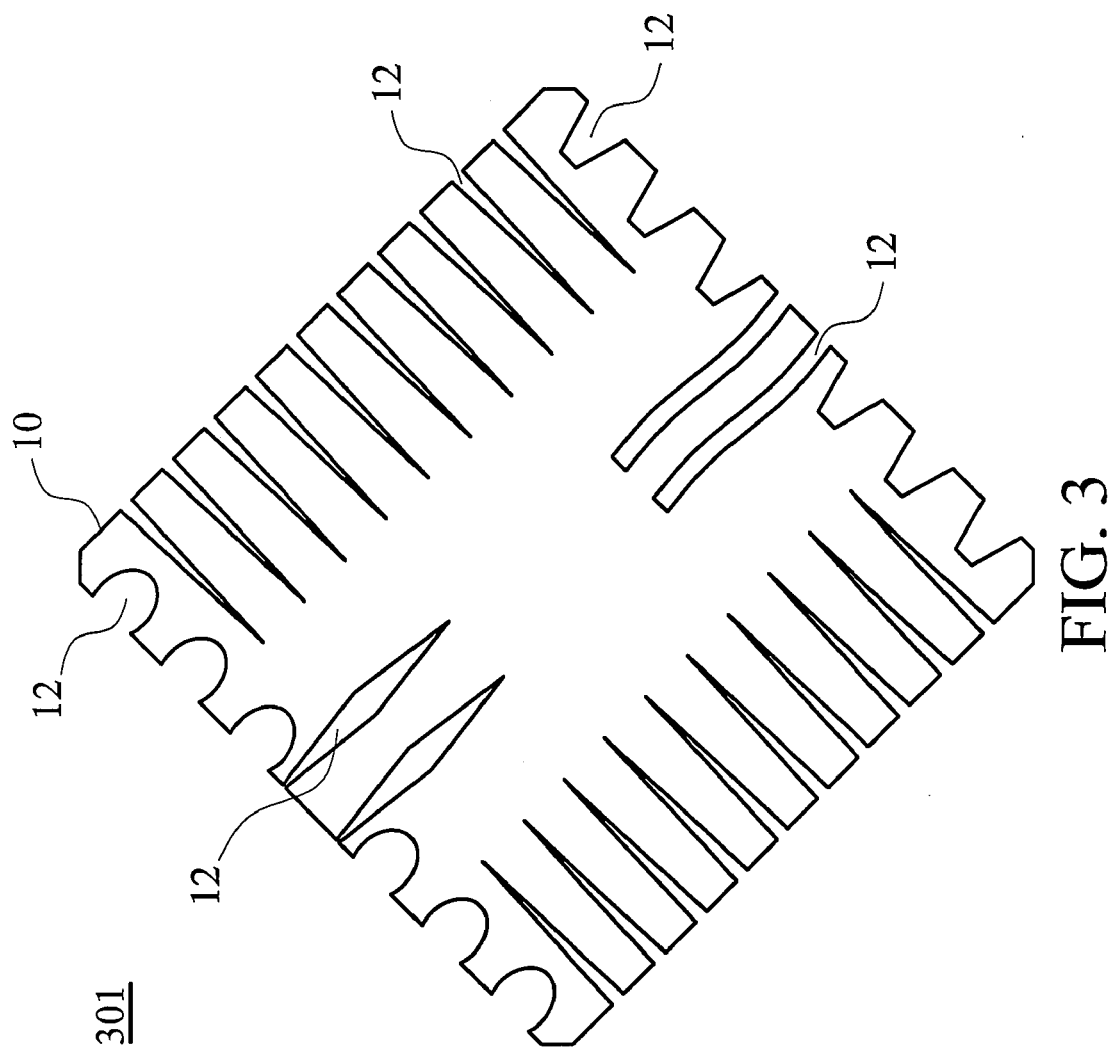

FIGS. 1-3 illustrate the metal thermal interface material of embodiments according to the invention. First, referring to FIG. 1, the metal thermal interface material 101 has the same through-holes 11 establishing an array arrangement within a metal foil 10, wherein all the through-holes 11 are closed and not interlinked with each other. The through-holes 11 are disposed along its borders, reducing the melt of the peripheral metal thermal interface material. Herein, the occupied square measure of all through-holes is about 36% of the total square measure of the metal thermal interface material. It should be noted that the occupied square measure of all through-holes can be optionally adjusted.

Referring to FIG. 2, wherein the metal thermal interface material 201 has different kinds of through-holes 11, 12, and 13. A part of the through-holes 11 of the metal thermal interface material 201 are closed and near the borders, while other through-holes 12 are not closed and across the borders. Further, yet other through-holes 13 are within the metal foil 10 and interlinked to each other via a channel 14.

Referring to FIG. 3, the metal thermal interface material 301 has through-holes 12 with different shapes. Since the through-holes 12 are not closed and across the borders, the metal foil 10 has zigzags or wave shapes on its border.

Accordingly, the hollowed-out metal thermal interface material comprises the metal thermal interface material 301 with non-closed through-holes 12 as shown in FIG. 3. It should be noted that the through-holes 12 can be disposed equidistantly or non-equidistantly. Moreover, the zigzags or wave shapes can also be random. Namely, the occupied square measure of all through-holes can be optionally adjusted by varying the numbers of through-holes or the distance between the through-holes.

Moreover, the through-holes can have the same or different shapes comprising geometric figures, symbols, characters, numbers, or combinations thereof, and are designed to attenuate and/or capture the excess melt of the thermal interface material.

The occupied square measure of the non-closed through-holes is proportional to the thickness of the metal thermal interface material and not more than 78% of the total square measure of the metal thermal interface material. In general, the occupied square measure of all through-holes is between 10~60% of the total square measure of the metal thermal interface material.

The hollowed-out metal thermal interface material can be fabricated by a drilling process, a stamping process, or a foundry process via liquid alloy. For example, a 51.0In-32.5Bi-16.5Sn alloy foil with thickness of 40 μm and 29% hollowed-out ratio can be fabricated by the drilling process.

When the metal thermal interface material is disposed on a thermal contact interface of an operating packaged microelectronic component or employed in a reflow process of an integrated circuit construction, the through-holes can reduce the volume of the melt of the metal thermal interface material. Further, the through-holes can also capture and disperse the melt of the metal thermal interface material, preventing the melt from accumulating to be a bead and overflowing to the outside of the interface.

In comparison with conventional solid metal thermal interface material, the hollowed-out metal thermal interface material can capture the melt via the hollowed-out ratio and avoid overflowing of the melt to the border of the thermal contact interface. Further, the thermal interface material can capture excess melt by the hollowed-out ratio, with the thermal interface material having a sufficient thickness. Suitable material of the hollowed-out thermal interface material of the invention is unlimited and can comprise In. Further, the thermal interface material comprises In and at least one of the elements including Bi, Sn, Zn, Ag. Further, according to some embodiments of the invention, the thermal interface material further comprises Au, Cu, Ga, Ti, Co, Ni, Ge, Al, Ce, La, Sc, Y, Pb, Cr, Cd, Si, or combinations thereof.

Table 1 lists the initial melting points and liquidius temperatures of the metal TIM alloys used in some embodiments according to the invention. The TIM alloys comprise most of above-mentioned elements and have initial melting points of between 40-157° C.

TABLE 1

Initial melting points and liquidius temperatures of alloys 1-11

| Alloy | In (wt %) | Bi (wt %) | Sn (wt %) | Ga (wt %) | Ag (wt %) | liquidius temperature (° C.) | initial melting point (° C.) |
|---|---|---|---|---|---|---|---|
| 1 | 50.5 | 32.0 | 16.5 | 1 | | 55 | 40 |
| 2 | 50.8 | 32.4 | 16.5 | 0.3 | | 55 | 49 |
| 3 | 50.9 | 32.5 | 16.5 | 0.1 | | 56 | 55 |
| 4 | 51 | 32.5 | 16.5 | | | 59 | 60 |

TABLE 1-continued

Initial melting points and liquidius temperatures of alloys 1-11

| Alloy | In (wt %) | Bi (wt %) | Sn (wt %) | Ga (wt %) | Ag (wt %) | liquidius temperature (° C.) | initial melting point (° C.) |
|---|---|---|---|---|---|---|---|
| 5  | 66.3 | 33.7 |      |   |   | 71  | 72  |
| 6  | 26   | 57   | 17   |   |   | 78  | 79  |
| 7  | 29.7 | 54.0 | 16.3 |   |   | 80  | 81  |
| 8  | 52   |      | 48   |   |   | 116 | 118 |
| 9  |      | 57   | 42   |   | 1 | 138 | 140 |
| 10 | 97   |      |      |   | 3 | 141 | 143 |
| 11 | 100  |      |      |   |   | 156 | 157 |

Figure 4:
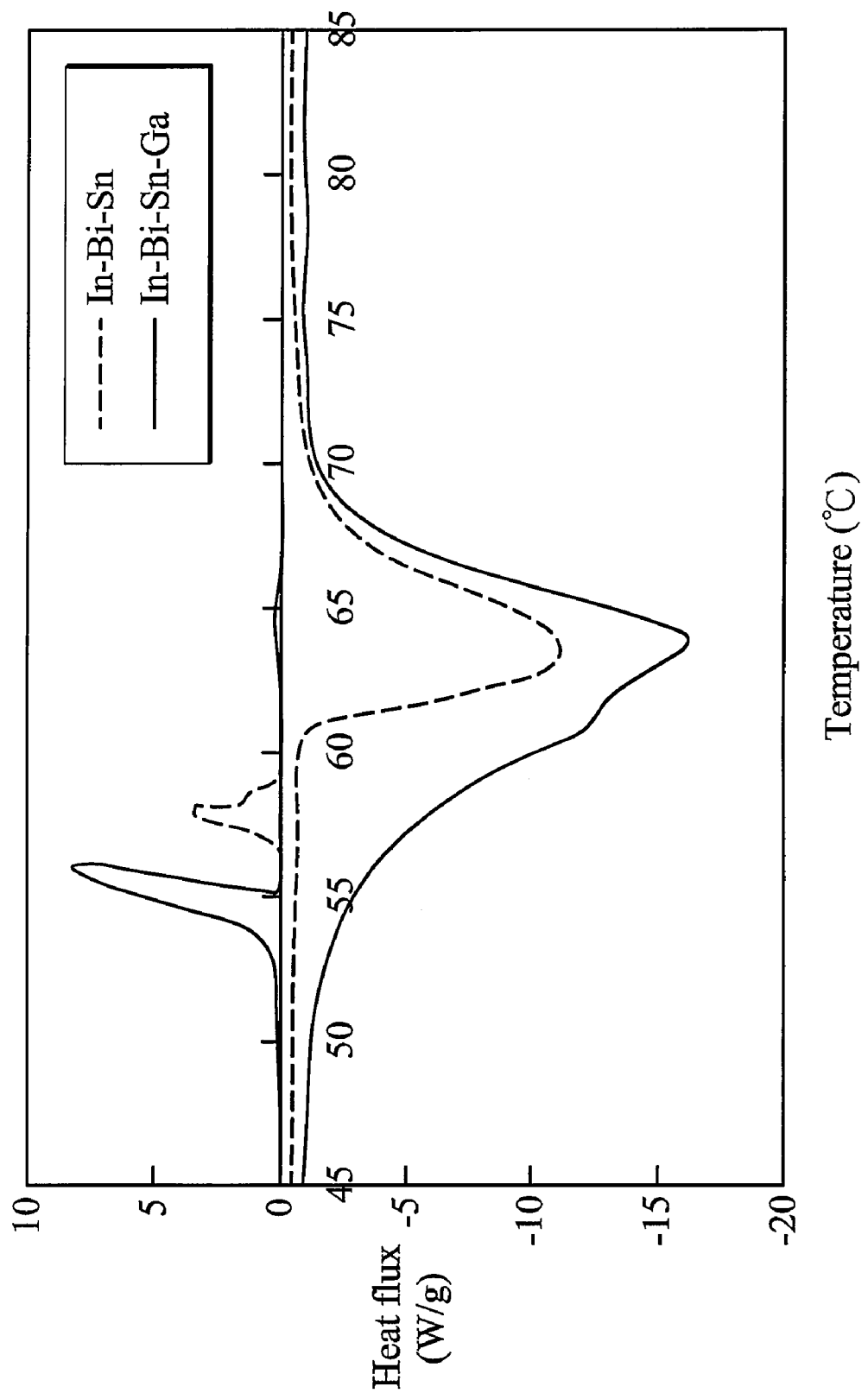
FIG. 4 is a diagram showing the heat flow variation from room temperature to 120° C. of alloy 2 and alloy 4 as disclosed in Table 1.

FIG. 4 shows the variations of differential heat flux with temperature of alloy 2 (In/Bi/Sn/Ga=50.8/32.4/16.5/0.3, referred to In—Bi—Sn—Ga alloy) and alloy 4 (In/Bi/Sn=51/32.5/16.5, referred to In—Bi—Sn alloy) in Table 1. The two alloys were respectively put in aluminum crucibles and measured by a differential scanning calorimeter (Du Pont Instruments 910) from room temperature to 120° C., and the heat flow changes were observed as shown in FIG. 4. Note that the initial melting point of the In—Bi—Sn alloy is reduced from 60° C. to 49° C. and its melting temperature range is broadened by adding 0.3 wt % Ga. That means In—Bi—Sn alloy with Ga is more apt to fuse than the alloy without Ga. This may result that the former alloy can fill up more easily the interstices between contact surfaces than the latter alloy, if the temperature at the interface is not very high. In sum, the alloys listed in Table 1 can be used in various operation situations to match with the alloy's properties.

Note that a metal TIM is more apt to be melted by reducing its initial melting point and broadening its melting temperature range. Thus, its performance in thermal resistance is good due to improvement of its fluidity. However, the better its fluidity the more probability for the melt to overflow. Therefore, hollowed-out metal TIMs of this invention is necessary, since overflowing of the TIM melt can be avoided.

Figure 5:
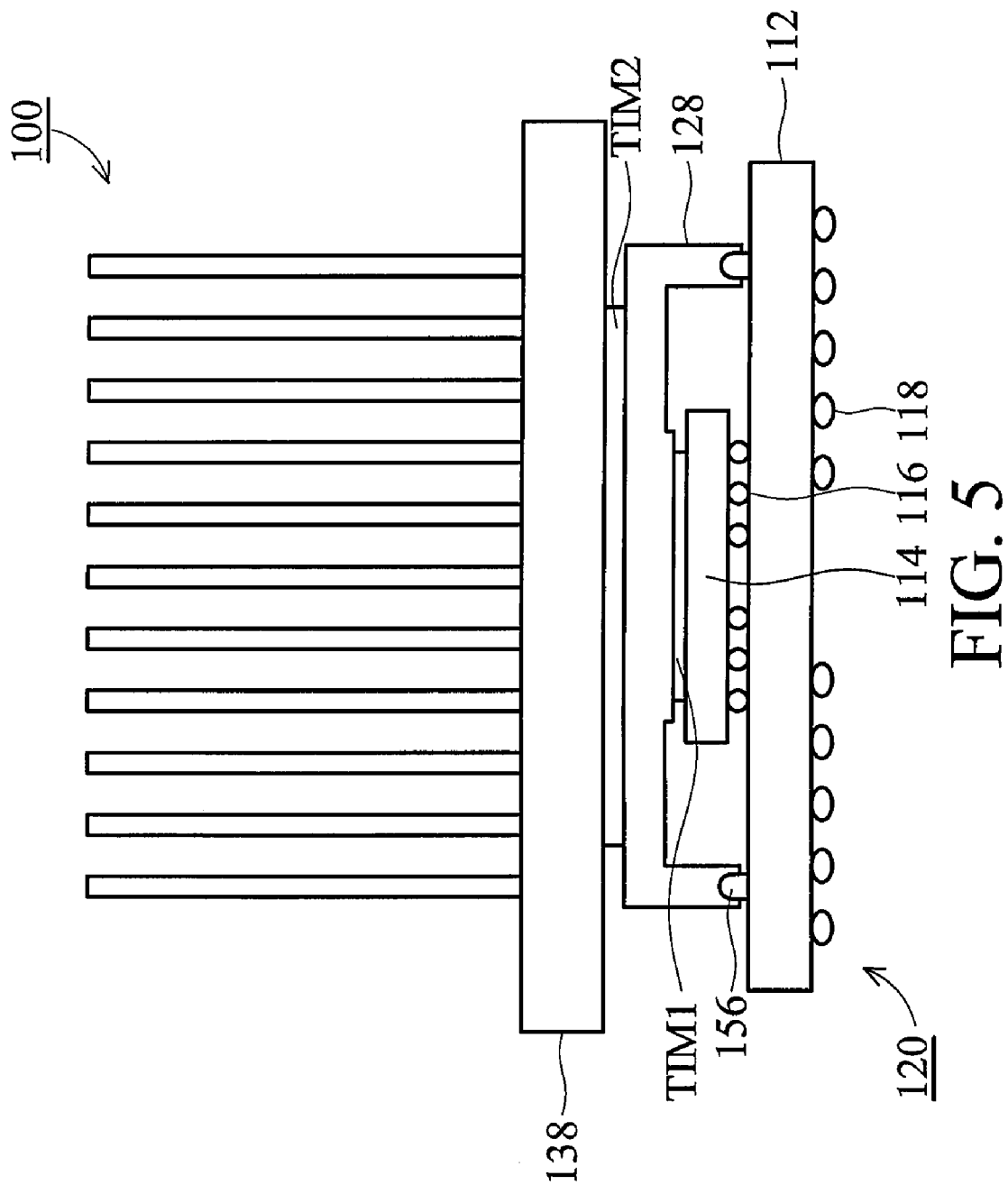
FIG. 5 is a cross section of a packaged microelectronic component comprising the metal thermal interface material according to an embodiment of the invention.

FIG. 5 shows a packaged microelectronic component introducing the hollowed-out metal thermal interface material (TIM) into the interface of the component. The packaged microelectronic component 100 comprises a packaged substrate 112 and an integrated circuit die 114 formed on the substrate 112. The electrical connection between the integrated circuit die 114 and the substrate 112 can be attached by a controlled collapse chip connection process (C4 process). The process is that metal bumps 116 are formed on the pads of the integrated circuit die 114, and then the metal bumps 116 and circuits of the substrate 112 are heated to be connected by a reflow heating process after alignment. Further, the integrated circuit die 114 can be electrically connected to the substrate 112 via wire bonding.

The packaged microelectronic component 100 comprises a plurality of tin balls array 118, disposed on a bottom surface 120 of the substrate 112. The substrate 112 can be electrically connected through pads to the metal bumps 116 and tin balls array 118. After the reflow heating process, the packaged microelectronic component 100 is electrically connected to a printed circuit board (not shown in FIG. 5) via the tin balls array 118. Further, in another embodiment, the packaged microelectronic component 100 can be electrically connected to a printed circuit board by mechanically connecting pins (not shown in FIG. 5) to a socket or by inserting pins into the printed circuit board and then soldering them together.

During the packaged microelectronic component 100 operates, the heat generated by the integrated circuit die 114 need be delivered out to the environment. In order to position the back surface of the integrated circuit die 114 on a heat dissipation element 128, at least one adhesion promoting layer (not shown) is generally formed on the back surface of the integrated circuit die 114, wherein the adhesion promoting layer can be a solderable-wettable layer. The adhesion promoting layer comprises Cr, V, Au, Ni, Zr, Ti or combinations thereof.

The heat dissipation element 128 can be a metal of high thermal conductivity, a aluminum matrix composite, a ceramic, or combinations thereof. At least one solderable-wettable metal layer, such as Cu, Ni, or organic material containing metal, can be formed on the surface of the heat dissipation element 128. A first thermal interface material (referred to TIM1) is disposed between the integrated circuit die 114 and the heat dissipation element 128 to reduce the contact thermal resistance and stabilize the junction. The TIM1 comprising a metal with low Young's modulus, such as pure indium, indium alloy with low solute content, or any alloys of low melting points that are in mushy state at operating temperature of the packaged microelectronic component.

Further, the greater thickness of the TIM1 the greater degree of thermal stress can be accommodated by the TIM 1, since Young's modulus of the TIM1 is low. In order to control the thickness of the TIM1 during the reflux heating process, a gasket can be disposed on the periphery of the TIM1 between the heat dissipation element 128 and the substrate 112 or the integrated circuit die 114. The gasket can not only help maintain the thickness of the first thermal interface material but also reduce the oxidation rate of the first thermal interface material. An underfill adhesive can be applied between the integrated circuit die 114 and the substrate 112 to increase the bonding strength between the integrated circuit die 114 and the substrate 112. The substrate 112 and the heat dissipation element 128 can be bonded by a solder alloy or solder paste 156, or screw fastening.

A heat sink 138 can be disposed on the heat dissipation element 128, wherein the heat sink 138 comprises a plurality of fin assemblies. A second thermal contact interface (referred to TIM2) is introduced into the interface between the bottom of the heat sink 138 and the top of the heat dissipation element 128. It should be noted that the heat sink 138 is bonded to the heat dissipation element 128 via the TIM2.

The hollowed-out metal thermal interface material of the invention can be disposed on the TIM4 between the integrated circuit die 114 and the heat dissipation element 128 and/or on the TIM2 between the heat dissipation element 128 and the heat sink 138. The hollowed-out metal thermal interface material disposed on the TIM1 has a thickness of not more than 200 µm, and the hollowed-out metal thermal interface material disposed on the TIM2 has a thickness of between 15-80 µm.

In an embodiment of the invention, the TIM1 and TIM2 both comprise the hollowed-out metal thermal interface material. In another embodiment of the invention, one of the TIM1 and sTIM2 comprises the hollowed-out metal thermal interface material, and the other one can be a conventional solid metal thermal interface material, thermal gel or thermal grease.

Although FIG. 5 shows that package of a single integrated circuit die, the package of multi-integrated circuit dies can also be achieved by the method of the invention. Further, the packaged microelectronic component as shown in FIG. 5 has several contacts distributed on the top and bottom surfaces of the substrate 112. In some embodiments of the invention, the contacts of the packaged microelectronic component (such as optoelectronic semiconductor) can be distributed on just either of the top and bottom surfaces of the substrate.

Moreover, in order to simplify fabrication or increase the heat dissipation of the packaged microelectronic component, each element of the packaged microelectronic component can be combined or rearranged. For example, the substrate 112 and the heat dissipation element 128 can be replaced by a multi-layer substrate (such as metal core printed circuit board) comprising a circuit, a dielectric layer, and a heat dissipation element. The hollowed-out thermal interface material can be disposed at a thermal interface of a thermal conduction path from an integrated circuit die to the heat sink.

Figure 6:
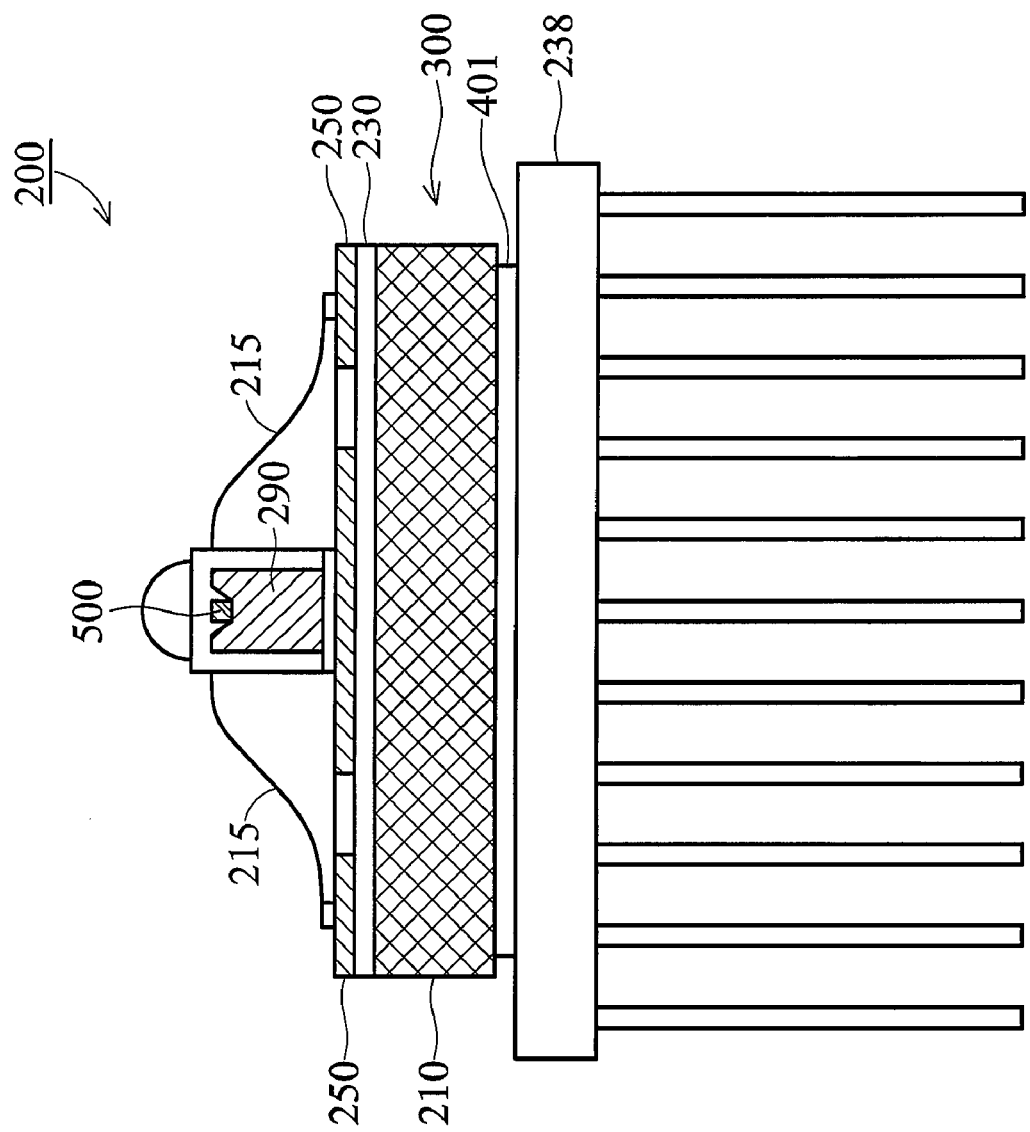
FIG. 6 is a cross section of a packaged microelectronic component comprising the metal thermal interface material according to another embodiment of the invention.

FIG. 6 shows a packaged microelectronic component 200 with a multi-layer packaged substrate 300, wherein the multi-layer packaged substrate 300 comprises a thermal conductive material plate 210, a dielectric layer 230 formed on the up-surface of the plate, and a circuit 250 formed on the dielectric layer. An integrated circuit die 500 (such as light emitting diode) is disposed on a molding frame 290 and is electrically connected to a circuit 250 of the multi-layer substrate 300 via a wire 215. The hollowed-out metal thermal interface material 401 can be disposed between the substrate 300 and the heat sink 238 to reduce the thermal contact resistance.

The heat sink may have further modifications in addition to the above described varieties related to TIM, single or multi-chips packages, contact arrangements, and integral structure.

The heat dissipation element can have an inside micro-channel structure or a planar vapor chamber. And the heat sink can be a cold plate with circulated water-cooling.

Accordingly, the invention provides a hollowed-out metal thermal interface material disposed at a thermal interface of a thermal conduction path from an integrated circuit die to the heat sink. The hollowed-out metal thermal interface material has a plurality of through-holes to reduce the amount of the melt of the metal thermal interface material, dispersing the melt of the metal thermal interface material, and preventing the melt from accumulating to be a bead.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thermal module, comprising:
a heat sink; and
a metal thermal interface consisting of a metal foil, located at a thermal conduction path from an integrated circuit die to the heat sink, wherein an initial melting temperature of the metal thermal interface is less than a maximum operational temperature of the integrated circuit die, wherein the metal thermal interface has discrete and disconnected through-holes in its body arranged such that when the integrated circuit die reaches its maximum operational temperature, melt from the metal thermal interface is captured by the through-holes, wherein the initial melting temperature of the metal thermal interface is between 40-157° C.

2. The thermal module as claimed in claim 1, wherein the metal foil has zigzags or wave shapes on its border.

3. The thermal module as claimed in claim 1, wherein the discrete and disconnected through-holes establish an array arrangement.

4. The thermal module as claimed in claim 1, wherein the discrete and disconnected through-holes establish a random arrangement.

5. The thermal module as claimed in claim 1, wherein the discrete and disconnected through-holes have the same or different shapes comprising geometric figures, symbols, characters, numbers, or combinations thereof.

6. The thermal module as claimed in claim 1, wherein the occupied square measure of all the discrete and disconnected through-holes is not more than 78% of the total square measure of the metal thermal interface material.

7. The thermal module as claimed in claim 1, wherein the occupied square measure of all discrete and disconnected through-holes is between 10~60% of the total square measure of the metal thermal interface material.

8. The thermal module as claimed in claim 1, wherein the metal thermal interface comprises In.

9. The thermal module as claimed in claim 8, wherein the metal thermal interface further comprises at least one of the elements including Sn, Ag, Bi, and Zn.

10. The thermal module as claimed in claim 8, wherein the metal thermal interface further comprises at least one of the elements including Au, Cu, Ga, Ti, Co, Ni, Ge, Al, Ce, La, Sc, Y, Pb, Cr, Cd, Si.

11. The thermal module as claimed in claim 1, wherein the thickness of the thermal interface is of between 15-200 μm.

12. The thermal module as claimed in claim 1, further comprising a gasket disposed on the periphery of the thermal interface.

13. A packaged microelectronic component, comprising:
a substrate comprising a surface;
an integrated circuit die formed on the surface;
a heat dissipation element disposed on the integrated circuit die;
a heat sink disposed on the heat dissipation element;
a first metal thermal interface disposed between the integrated circuit die and the heat dissipation element; and
a second metal thermal interface disposed between the heat dissipation element and the heat sink, wherein at least one of the first and second metal thermal interfaces have an initial melting temperature less than a maximum operational temperature of the integrated circuit die, wherein the initial melting temperature is of between 40-157° C., wherein at least one of the first and second metal thermal interfaces have discrete and disconnected through-holes in its body arranged such that when the integrated circuit die reaches its maximum operational temperature, melt from the metal thermal interface is captured by the through-holes.

14. The packaged microelectronic component as claimed in claim 13, wherein the thickness of the first metal thermal interface is not thicker than 200 μm.

15. The packaged microelectronic component as claimed in claim 13, wherein the thickness of the second metal thermal interface is of between 15-80 μm.

16. A packaged microelectronic component, comprising:
a multi-layer substrate comprising a thermal conductive material layer, a dielectric layer formed on a upside surface of the thermal conductive material, and circuits formed on the dielectric layer;
an integrated circuit die electrically connecting to the circuits;
an heat sink disposed on a downside surface of the thermal conductive material; and
an metal thermal interface consisting of a metal foil, located at a thermal conduction path from the integrated circuit die to the heat sink, wherein an initial melting temperature of the metal thermal interface is less than a maximum operational temperature of the integrated circuit die, wherein the initial melting temperature is of between 40-157° C., wherein the metal thermal interface has discrete and disconnected through-holes in its body arranged such that when the integrated circuit die reaches its maximum operational temperature, melt from the metal thermal interface is captured by the through-holes.

17. The packaged microelectronic component as claimed in claim 16, wherein the integrated circuit die comprises an optoelectronic semiconductor.

18. The packaged microelectronic component as claimed in claim 17, wherein the metal thermal interface is disposed between the multi-layer substrate and the heat sink.

19. The packaged microelectronic component as claimed in claim 13, wherein at least one of the first and second metal thermal interfaces further have zigzags or wave shapes on its border.

20. The packaged microelectronic component as claimed in claim 16, wherein the metal thermal interface further has zigzags or wave shapes on its border.

* * * * *